United States Patent
Gershon

(10) Patent No.: US 6,178,208 B1
(45) Date of Patent: Jan. 23, 2001

(54) SYSTEM FOR RECOVERY OF DIGITAL DATA FROM AMPLITUDE AND PHASE MODULATED LINE SIGNALS USING DELAY LINES

(75) Inventor: Eugen Gershon, San Jose, CA (US)

(73) Assignee: Legerity, Austin, TX (US)

(*) Notice: Under 35 U.S.C. 154(b), the term of this patent shall be extended for 0 days.

(21) Appl. No.: 08/992,813

(22) Filed: Dec. 18, 1997

(51) Int. Cl.[7] .............. H03D 3/00; H04L 7/00; H03F 1/26
(52) U.S. Cl. .............. 375/322; 375/371; 330/149
(58) Field of Search .............. 375/322, 320, 375/371, 373, 375, 268, 345, 257, 222; 330/149, 144, 145, 151

(56) References Cited

U.S. PATENT DOCUMENTS

| | | | |
|---|---|---|---|
| 4,736,242 | * 4/1988 | Takanashi et al. | 358/44 |
| 5,132,572 | 7/1992 | Woo | 326/73 |
| 5,153,527 | * 10/1992 | Yaguchi | 329/307 |
| 5,220,216 | 6/1993 | Woo | 326/50 |
| 5,227,679 | 7/1993 | Woo | 326/50 |
| 5,264,745 | 11/1993 | Woo | 326/62 |
| 5,349,612 | 9/1994 | Guo et al. | 325/371 |
| 5,363,419 | 11/1994 | Ho | 375/376 |
| 5,367,542 | 11/1994 | Guo | 375/359 |
| 5,400,370 | 3/1995 | Guo | 375/371 |
| 5,452,333 | 9/1995 | Guo et al. | 375/371 |
| 5,457,336 | 10/1995 | Fang et al. | 257/322 |
| 5,457,719 | 10/1995 | Guo et al. | 375/375 |
| 5,787,117 | * 7/1998 | Ash | 375/223 |

* cited by examiner

Primary Examiner—Chi H. Pham
Assistant Examiner—Khai Tran
(74) Attorney, Agent, or Firm—McDermott, Will & Emery

(57) ABSTRACT

A demodulation system is provided with input variable gain amplifiers controlled by a digital amplitude processing unit to adjust the level of a received amplitude and phase modulated line signal. An amplitude decoder determines a digital amplitude value corresponding to the amplitude of the received signal. A phase matching circuit compares the received signal with a set of reference phase values to determine the phase of the received signal. The reference phase values are produced by delay cells connected in series in a receive digital delay line. A reference digital delay line supplied by a reference clock signal from a local crystal oscillator is used as a timing reference for the adjustment of the receive delay line. Based on the detected amplitude and phase values of the received signal, a symbol decoder identifies the transmitted digital data.

18 Claims, 1 Drawing Sheet

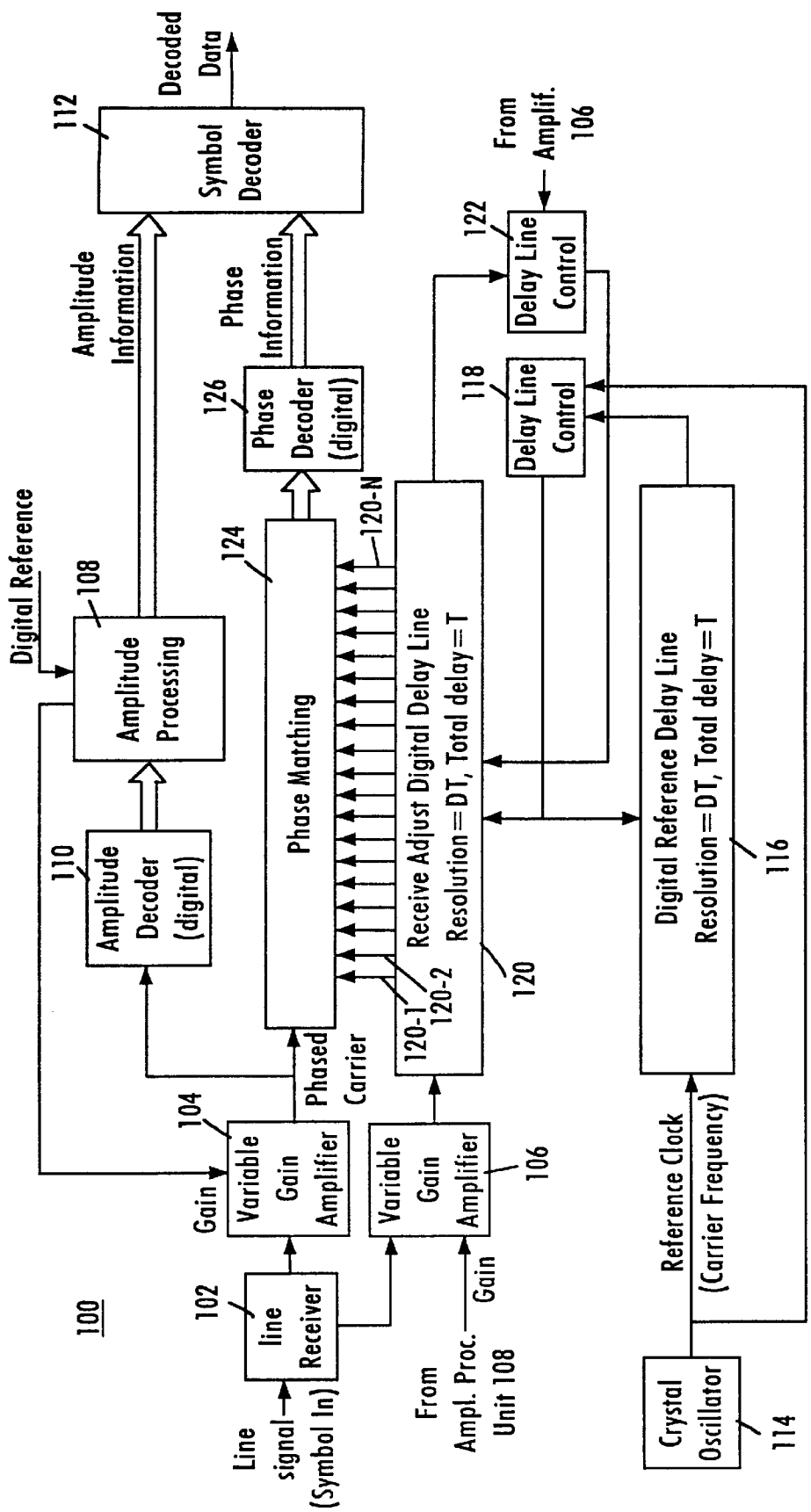
Figure 1 Receiver Block Diagram

SYSTEM FOR RECOVERY OF DIGITAL DATA FROM AMPLITUDE AND PHASE MODULATED LINE SIGNALS USING DELAY LINES

TECHNICAL FIELD

The present invention relates to digital data transmission using analog signals and, more particularly, to a novel demodulation system for recovery of digital data from an amplitude and phase modulated line signal using digital delay lines.

BACKGROUND ART

In data networks designed to receive, switch and transmit analog signals, digital devices are attached to a communication line via a modem that converts digital data to analog line signals and vice versa. The modem modulates data prior to sending them over such communication lines as a telephone wire, a CATV coaxial cable, an optical cable, or a wireless communication link. The basis for analog signal transmission is a continuous constant-frequency signal known as a carrier signal. For example, the carrier signal may be defined as $v_s'(t)=V_s\cos(2\pi ft+\phi_s)$, where f is the frequency, $V_s$ is the amplitude, and $\phi_s$ is the phase of the carrier signal. Modulation involves operation on one or more of the three characteristics of the carrier signal: amplitude, frequency or phase. Accordingly, three basic modulation techniques are used for transforming digital data into analog line signals: amplitude modulation, frequency-shift keying and phase modulation or phase-shift keying.

Digital data are represented by a finite number of values, each of which defines a digital symbol. Each symbol may be composed of one or more bits. Amplitude modulation enables a modem to transmit analog equivalents of digital symbols by varying the amplitude of the carrier signal. For example, if a symbol consists of two bits, the entire continuous range of the signal amplitudes is divided into four bands, each of which represents one of four possible symbols 00, 01, 10 or 11. For instance, for a signal in a range from −3 V to 3 V, amplitudes smaller than −2 V may represent 00, amplitudes between −2 V and 0 V may correspond to 01, amplitudes between 0 V and 2 V may represent 10, and amplitudes larger than 2 V may correspond to 11. Alternatively, such transformation may be carried out by pulse-amplitude modulation that uses a pulse carrier.

Frequency-shift keying may use different frequencies of the carrier signal to represent binary 1 and binary 0. This technique is suitable for low-speed devices.

In phase modulation, the carrier signal is shifted a certain number of degrees in response to the digital pattern coming from a digital device. For example, to represent two-bit symbols 00, 01, 10 or 11, four phase values of the carrier signal are required. For instance, a phase value between 0 and $\pi/2$ may correspond to 00, a phase value between $\pi/2$ and $\pi$ may represent 01, etc.

Amplitude and phase modulations of a carrier signal may be combined to form a line signal with amplitude and phase representing digital data to be transmitted. Each symbol of the digital data may be defined as a vector with a certain length represented by the amplitude of the line signal, and a certain angle or phase with respect to a reference, for example, the horizontal axis. For instance, in each 4-bit digital symbol, two bits may be represented by four different values of amplitude, and two bits may be represented by four different values of phase.

Various demodulation techniques have been developed for modems that convert digital data into modulated analog signals at a transmitting side and recover the digital data from the analog signals at a receiving side. These techniques are built either entirely on digital circuitry or entirely on analog circuitry. However, digital demodulators are slow and may be used only for low-speed applications, such as voice-band modems. Although analog demodulators are much faster than the digital systems, their reliability is poor.

Thus, it would be desirable to provide a novel demodulation system for recovery digital data from analog line signals, which would be faster than the digital systems and more reliable than the analog systems.

Also, it would be desirable to provide a novel system for demodulating amplitude and phase modulated line signals representing digital data.

DISCLOSURE OF THE INVENTION

Accordingly, one advantage of the present invention is in providing a fast and reliable system for converting digital data into analog line signals.

Another advantage of the present invention is in providing a novel system for amplitude and phase modulation of line signals representing digital data.

The above and other advantages of the invention are achieved, at least in part, by providing a demodulation system that comprises an amplitude decoder that detects an amplitude value corresponding to an amplitude of a received amplitude and phase modulated line signal. A receive delay line is supplied with the line signal to produce a plurality of reference phase values delayed with respect to each other. The reference phase values are aligned with respect to a mark on the received line signal. A reference delay line supplied with a reference signal is used for adjusting the receive delay line. A phase detector compares the received line signal with the plurality of reference phase values to determine a phase value corresponding to the phase of the line signal. A symbol decoder decodes the determined amplitude and phase values to identify digital data represented by the amplitude and phase of the line signal.

In accordance with one aspect of the invention, a reference delay line control circuit may be coupled to an output of the reference delay line to compare the reference signal delayed by the reference delay line with a period of the reference signal supplied by a local reference source, in order to adjust a reference delay time provided by the reference delay line. The reference delay line control circuit is coupled to a delay control input of the receive delay line to adjust the delay time of the receive delay line in accordance with the reference delay time.

In accordance with another aspect of the invention, a receive delay line control circuit may be coupled to an output of the receive delay line to align signals delayed in the receive delay line with the mark on the received line signal.

Preferably, the receive and reference delay lines comprise a plurality of digital delay cells connected in series. The reference phase values are produced at outputs of the delay cells in the receive delay line and provide a reference phase range corresponding to a total delay time of the receive delay line.

In accordance with a method of the present invention, the following steps are carried out to recover digital data from a received amplitude and phase modulated line signal:

decoding the line signal to determine an amplitude value corresponding to its amplitude, calibrating a reference delay line using a reference signal at the frequency of the line signal, adjusting a receive delay line in accordance with the reference delay line, supplying the receive delay line with the line signal to produce reference phase values delayed with respect to each other, comparing the line signal with the reference phase values to determine a phase value corresponding to the phase of the line signal, and decoding the amplitude and phase values to identify digital data represented by the amplitude and phase of the line signal.

The reference phase values may be aligned with respect to a mark on the received line signal.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

BRIEF DESCRIPTION OF DRAWINGS

FIG. 1 is a block diagram that illustrates a receiver of the present invention.

BEST MODE FOR CARRYING OUT THE INVENTION

Although the invention has general applicability in the field of data processing, the best mode for practicing the invention is based in part on the realization of a receiver for a modem that converts digital data into amplitude and phase modulated analog line signals at a transmitting side and recovers the digital data from the amplitude and phase modulated analog line signals at a receiving side.

Referring to FIG. 1, a receiver 100 for a modem comprises a line receiver 102 that receives an amplitude and phase modulated line signal from a communication line. The line signal represents digital data encoded at a transmitting side of the modem. Amplitude and phase modulation of a line signal carried out to encode digital data is discussed in our copending application Ser. No. 08/992,816 entitled "SYSTEM FOR PROVIDING AMPLITUDE AND PHASE MODULATION OF LINE SIGNALS USING DELAY LINES," filed concurrently herewith and incorporated by reference.

The receiver 100 of the present invention may be used for various types of transmission media, such as a twisted-pair telephone cable, CATV coaxial cable, fiber optical cable, or wireless communication line using radio or infrared signalling The line receiver 102 may include line-matching circuitry, as well as a bandpass filter which eliminates band noise and an amplitude and delay equalizer. The line receiver structure and functions are conventional for a modem receiver.

The output of the line receiver is connected to signal inputs of variable gain amplifiers 104 and 106 provided to adjust signal level. Gain control inputs of the amplifiers 104 and 106 are coupled to an output of an amplitude processing unit 108. A digital amplitude decoder 110 connected to the output of the amplifier 104 provides the amplitude processing unit 108 with a digital value indicating the received signal level. Via a reference input, the amplitude processing unit is supplied with a digital reference value, for example, from a ROM that stores a table of reference values preloaded to accommodate the receiver 100 to various types of transmission media and various external conditions, such as temperature, and humidity. Based on the reference value, the amplitude processing unit 108 calculates adjustment values that control gains of the amplifier 104 and 106. The adjustment value for the amplifier 104 is calculated to adjust the output signal of the amplifier 104 so as to fit the linear range of the receiver circuits. The adjustment value for the amplifier 106 is calculated to maintain the amplitude of its output signal at a constant level, in order to feed phase detection circuitry connected to the output of the amplifier 106.

Also, the amplitude processing unit 108 has an amplitude information output connected to a symbol decoder 112 to supply it with a digital value indicating is the amplitude of the received line signal.

To support the phase detection circuitry, the receiver 100 is provided with a crystal oscillator 114 that produces a reference clock signal at the carrier frequency of the received line signal. The reference clock signal is supplied to an input of a digital reference delay line 116 that serves as a local timing reference. The reference delay line 116 consists of n delay cells connected in series. Each of the delay cells composed, for example, of a pair of inverters delays the input clock signal by a delay amount equal to $\Delta T$. Thus, the total delay time T provided by the delay line 116 is equal to $n\Delta T$. It should be understood that other delay structures may be used in the delay line 116, instead of pairs of inverters.

The output of the delay line 116 is coupled to a reference delay line control unit 118 having its output connected to delay control inputs of the reference delay line 116 and a receive adjust digital delay line 120. The reference delay control unit 118 provides continuous calibration of the reference delay line 116. The control unit 118 supplied with the reference clock signal from the crystal oscillator 114 compares the delay of the reference clock signal in the delay line 116 against the reference clock period provided by the crystal oscillator 114 and adjusts the delays of the delay cells until the compared values are matched. A digital on-the-fly time delay calibrator suitable for the present invention is described, for example, in U.S. Pat. No. 5,457,719 of Oct. 10, 1995, incorporated herewith by reference.

Simultaneously with adjusting the delay of the digital reference delay line 116, the reference delay line control 118 controls the delay time of the receive adjust digital delay line 120 connected to the output of the variable gain amplifier 106. The delay line 120 has the same structure as the reference delay line 116 and consists of n delay cells connected in series. The output signal of the amplifier 106 having the phase corresponding to the phase of the received line signal may be supplied to the first delay cell of the delay line 120. The delay cells in the delay line 120 provide delay by an equal delay amount equal to $\Delta T$. The reference delay line control unit 118 controls the delay cells in the delay line 120 to make their delay time equal to the delay time of the delay cells in the reference delay line 116.

The delay line 120 is provided with outputs 120-1, 120-2, . . . , 120-n for supplying signals produced at the output of each delay cell. The first output 120-1 supplies the output signal produced by the first delay cell and delayed by $\Delta T$ with respect to the received signal. The signal at the second output 112-2 is delayed by $2\Delta T$, etc. Finally, the last output 112-n corresponds to the output signal of the delay line 100 delayed by delay $T=n\Delta T$ with respect to the received signal.

Before a transmitter sends a packet of modulated data, a steady mark signal, for example, a pilot is transmitted over a communication line to provide timing between data modulation and demodulation. The mark signal may be detected at the output of the amplifier 106 and supplied to a receive delay line control unit 122 to provide the adjustment of the receive adjust digital delay line 120.

As the mark signals define the average phase value of the received signal, the receive delay line control unit 122 adjusts the delay line 120 so as to align the signals produced at the outputs 120-1, 120-2, . . . , 120-n with the mark signals.

Various adjustment schemes may be used to adjust the digital delay line 120. By way of example, reference is made to U.S. Pat. Nos. 5,349,612 and 5,457,719 to Guo et al. of Sep. 20, 1994 and Oct. 10, 1995, respectively, and to U.S. Pat. Nos. 5,367,542 and 5,400,370 to Guo of Nov. 22, 1994 and Mar. 21, 1995, respectively. Those patents assigned to the assignee of the present patent application may be consulted for an understanding of the specific details of time delay regulators.

The delayed signals produced at the outputs 120-1 to 120-n of the delay line 120 are supplied to parallel reference inputs of a phase matching circuit 124 which uses these input signals as reference phase values for detecting the phase of the received signal supplied from the output of the amplifier 104. The phase matching circuit 124 compares the phase of the received signal with n reference phase values from the delay line 120, and produces an analog signal having a phase corresponding to the reference phase value closest to the phase of the received signal. As the resolution of the receive adjust delay line 120 is equal to ΔT, the phase matching circuit 124 measures the phase of the received signal with an error not higher than ΔT/2.

A digital phase decoder 126 decodes the analog signal produced by the phase matching circuit 124 to generate a digital phase value indicating the phase of the received signal. The digital phase value, along with the digital amplitude value from the amplitude processing unit 108, is supplied to the symbol decoder 112 that produces the digital symbol corresponding to the detected amplitude and phase values. For example, in each received 4-bit digital symbol, two bits may be represented by an amplitude value, and two bits may be represented by a phase value.

In the embodiment of the present invention disclosed above, delay lines were used to produce digital phase values. Amplitude demodulation is performed outside of the delay lines. Alternatively, amplitude modulation and demodulation, as well as phase modulation and demodulation may be carried out inside delay lines. In this case, individual delay cells carry analog values of amplitude as well as digital values of phase.

There accordingly has been described a system for recovery digital data from a received amplitude and phase modulated line signal, wherein digital and analog circuits are combined for demodulating the line signal. A received line signal is adjusted by variable gain amplifiers controlled by a digital amplitude processing unit to fit the demodulation system. An amplitude decoder determines a digital amplitude value corresponding to the amplitude of the received signal. A phase matching circuit compares the received signal with a set of reference phase values to determine the phase of the received signal. The reference phase values are produced by delay cells connected in series in a receive adjust digital delay line. A reference digital delay line supplied by a reference clock signal from a local crystal oscillator is used as a timing reference for the adjustment of the receive adjust delay line. Based on the detected amplitude and phase values of the received signal, a symbol decoder identifies the transmitted digital data.

In this disclosure, there are shown and described only the preferred embodiments of the invention, but it is to be understood that the invention is capable of changes and modifications within the scope of the inventive concept as expressed herein.

What is claimed is:

1. A system for recovery of digital data from a received amplitude and phase modulated line signal, comprising:
   an amplitude decoder responsive to said received line signal for detecting an amplitude value corresponding to an amplitude of said line signal,
   a receive delay line responsive to said received line signal for producing a plurality of reference phase values delayed with respect to each other, said reference phase values being aligned with respect to a mark on said received line signal,
   a reference delay line supplied with a reference signal at a frequency of said line signal for adjusting said receive delay line,
   a phase matching circuit for comparing said received line signal with said plurality of reference phase values to determine a phase value corresponding to a phase of said line signal, and
   a symbol decoder responsive to said amplitude value and said phase value for identifying digital data represented by the amplitude and phase of said line signal.

2. The system of claim 1, further comprising a reference delay line control circuit coupled to an output of said reference delay line for comparing said reference signal delayed by said reference delay line with a period of said reference signal supplied by a local reference source to adjust a reference delay time provided by said reference delay line.

3. The system of claim 2, wherein said reference delay line control circuit is coupled to a delay control input of said receive delay line to adjust receive delay time of said receive delay line in accordance with said reference delay time.

4. The system of claim 1, further comprising a receive delay line control circuit coupled to an output of said receive delay line to align signals delayed in said receive delay line with said mark on said received line signal.

5. The system of claim 1, wherein said receive and reference delay lines comprises a plurality of digital delay cells connected in series.

6. The system of claim 5, wherein said reference phase values are produced at outputs of said delay cells in said receive delay line.

7. The system of claim 6, wherein said reference phase values provides a reference phase range corresponding to a total delay time of said receive delay line.

8. The system of claim 1, further comprising at least one variable gain amplifier for adjusting a level of said received line signal.

9. The system of claim 8, wherein said amplitude decoder is coupled to an output of said variable gain amplifier to produce said amplitude value in a digital form.

10. The system of claim 1, further comprising a crystal oscillator for producing said reference signal.

11. The system of claim 1, further comprising a phase decoder coupled to said phase matching circuit providing said phase value in a digital form.

12. A method of recovery digital data from a received amplitude and phase modulated line signal, comprising the steps of:

decoding said line signal to determine an amplitude value corresponding to an amplitude of said line signal, calibrating a reference delay line using a reference signal at a frequency of said line signal, adjusting a receive delay line in accordance with said reference delay line, supplying said receive delay line with said line signal to produce reference phase values delayed with respect to each other, comparing said line signal with said reference phase values to determine a phase value corresponding to a phase of said line signal, and decoding said amplitude value and said phase value to identify digital data represented by the amplitude and phase of said line signal.

13. The method of claim 12, further comprising the step of aligning said reference phase values with respect to a mark on said received line signal.

14. The method of claim 12, wherein said step of calibrating comprises the step of supplying said reference delay line with said reference signal and comparing the delayed reference signal with a period of the reference signal produced by a local reference source.

15. A system for demodulating an amplitude and phase modulated signal, comprising:

an amplitude decoder for detecting an amplitude value of the modulated signal, an adjust delay line for producing a plurality of reference phase values delayed with respect to each other, a phase matching circuit for comparing the modulated signal with the plurality of reference phase values to determine a phase value of the modulated signal, and a symbol detector responsive to the amplitude value and the phase value of the modulated signal for identifying data represented by the modulated signal.

16. The system of claim 15 further comprising a reference delay line supplied with a reference signal for adjusting the adjust delay line.

17. The system of claim 15, further comprising a reference signal generator for producing the reference signal at a frequency of the modulated signal.

18. The system of claim 15, wherein the reference phase values produced by the adjust delay line are aligned with respect to the modulated signal.

* * * * *